US012802940B2

(12) United States Patent
Liu et al.

(10) Patent No.: US 12,802,940 B2
(45) Date of Patent: Nov. 17, 2026

(54) MULTI-PORT PHASE COMPENSATION NESTED MICROWAVE-PLASMA APPARATUS FOR DIAMOND FILM DEPOSITION

(71) Applicant: Hangzhou Dianzi University, Hangzhou (CN)

(72) Inventors: Jie Liu, Hangzhou (CN); Liping Yan, Hangzhou (CN); Zhiqun Cheng, Hangzhou (CN); Tiansong Deng, Hangzhou (CN)

(73) Assignee: Hangzhou Dianzi University, Hangzhou (CN)

( * ) Notice: Subject to any disclaimer, the term of this patent is extended or adjusted under 35 U.S.C. 154(b) by 825 days.

(21) Appl. No.: 18/306,455

(22) Filed: Apr. 25, 2023

(65) Prior Publication Data

US 2023/0260756 A1 Aug. 17, 2023

(30) Foreign Application Priority Data

Apr. 26, 2022 (CN) ......................... 202210446059.8

(51) Int. Cl.
*H01J 37/32* (2006.01)
*C23C 16/27* (2006.01)
*C23C 16/511* (2006.01)

(52) U.S. Cl.
CPC ...... *H01J 37/32266* (2013.01); *C23C 16/274* (2013.01); *C23C 16/511* (2013.01); *H01J 37/3222* (2013.01); *H01J 37/32229* (2013.01); *H01J 37/32256* (2013.01); *H01J 37/32715* (2013.01); *H01J 37/32201* (2013.01); *H01J 2237/002* (2013.01); *H01J 2237/24585* (2013.01); *H01J 2237/332* (2013.01)

(58) Field of Classification Search
CPC ...... H05H 1/461; H05H 1/4622; C30B 29/04; C23C 16/274; C23C 16/511; H01J 37/32192; H01J 37/32247; H01J 37/32256
See application file for complete search history.

(56) References Cited

U.S. PATENT DOCUMENTS

| | | | | |
|---|---|---|---|---|
| 3,677,228 A * | 7/1972 | Panish | C30B 19/061 | 118/422 |
| 5,902,404 A * | 5/1999 | Fong | H05H 1/46 | 156/345.36 |
| 2001/0048981 A1* | 12/2001 | Suzuki | C23C 16/4408 | 427/535 |
| 2008/0129208 A1* | 6/2008 | Kumar | B23K 1/012 | 219/121.36 |

(Continued)

FOREIGN PATENT DOCUMENTS

CN 112074071 A * 12/2020 ........... H05H 1/4622

OTHER PUBLICATIONS

English computer translation of CN-112074071-A (Year: 2026).*

*Primary Examiner* — Matthew J Song
(74) *Attorney, Agent, or Firm* — Hemisphere Law, PLLC

(57) ABSTRACT

Disclosed is a multi-port phase compensation nested apparatus for microwave-plasma deposition of diamond films. A resonant cavity part includes an inner cavity body, a ring waveguide, a slot opening, a quartz ring, a metal platform, a deposition platform, a substrate, and a recess, wherein the slot opening is located on a wall of the inner cavity body, communicating the inner cavity body with the ring waveguide.

10 Claims, 9 Drawing Sheets

(56) References Cited

U.S. PATENT DOCUMENTS

| | | | | |
|---|---|---|---|---|
| 2010/0038230 | A1 | 2/2010 | Radoiu et al. | |
| 2010/0231144 | A1* | 9/2010 | Leek | H05H 9/00<br>315/39 |
| 2014/0306604 | A1* | 10/2014 | Richardson | H01J 23/15<br>315/39.51 |
| 2015/0162167 | A1 | 6/2015 | Choi et al. | |
| 2016/0029472 | A1* | 1/2016 | Jevtic | H01J 37/32467<br>315/39 |
| 2018/0049304 | A1 | 2/2018 | Kim et al. | |
| 2019/0362945 | A1* | 11/2019 | Liu | H01J 37/32256 |
| 2021/0087676 | A1* | 3/2021 | Gicquel | C30B 25/20 |

* cited by examiner

MULTI-PORT PHASE COMPENSATION NESTED MICROWAVE-PLASMA APPARATUS FOR DIAMOND FILM DEPOSITION

TECHNICAL FIELD

The present disclosure relates to the technical field of diamond film deposition and, more particularly, to a multi-port phase compensation nested apparatus for microwave-plasma deposition of diamond films.

BACKGROUND

As a low-temperature plasma technique, microwave plasmas have characteristics of electrodeless discharge and concentrated discharge area, which can effectively avoid pollution of electrodes and cavity walls. Moreover, microwave plasmas have a high ionization degree and strong reactivity that result in a large plasma energy density and an elevated electron temperature. Therefore, highly concentrated atomic hydrogen can be obtained, in addition to a very stable discharge process. Therefore, microwave-plasma deposition is a method for the deposition of high-quality diamond films.

Typical microwave plasmas include electron cyclotron resonance microwave plasma, surface wave plasma, and resonant cavity microwave plasma. Among them, the electron cyclotron resonance microwave plasma is a resonance phenomenon that uses an external magnetic field to excite electrons and microwave frequencies. This can greatly increase plasma density. However, due to low-pressure working conditions, the deposition rate is very low, and the quality of the diamond film is also affected. The typical characteristic of surface wave plasma is that the microwave can only excite the plasma during transmission along a plasma surface and cannot enter the plasma interior. Different from the above two plasmas, the resonant cavity microwave plasma is generated by directly exciting gases on the basis of a high-intensity-variation electric field formed by microwaves in the resonant cavity, with a high energy density and a high concentration of active groups, more suitable for depositing thin film materials.

In China, the technique of the 2.45 GHz microwave plasma CVD (MPCVD) apparatus for diamond film deposition has completed a journey from the quartz tube type, quartz bell jar type, cylindrical resonant cavity type, loop antenna type, to ellipsoidal resonant cavity type and many other types of MPCVD devices. The development of this device revealed issues such as excessive microwave energy absorption, easy etching of the dielectric window, low tunability, and unsatisfactory deposition rates. So far, research teams in China have conducted in-depth and systematic research on MPCVD of various resonant cavity structures. For example, Tang Weizhong's team at the Functional Research Institute of Beijing University of Science and Technology has taken the lead nationwide in the development of the CAP-type cylindrical resonant cavity and ellipsoidal resonant cavity MPCVD apparatuses; the first MPCVD apparatus independently developed by the team of Hao Yue at the Wuhu Research Institute of Xidian University, can grow polycrystalline diamond heat dissipation substrates of 2 to 3 inches; Wang Jianhua's team at the Hubei Key Laboratory of Plasma Chemistry and New Materials of Wuhan Institute of Technology has made substantial progress in the development of a full range of MPCVD apparatuses covering 1 kW to 75 kW. However, in comparison with foreign research teams, breakthroughs are required in key technologies such as the independent optimization design and large size of microwave plasma resonant cavities.

In 1994, a research team from the University of Wuppertal in Germany developed a slot antenna (SLAN) type plasma source characterized in that the plasma generated thereby is not limited in the area by the microwave wavelength, and has diameters ranging from 4 cm to 67 cm, which, correspondingly, require different ranges of gas pressure to maintain plasma uniformity. A SLAN source with a diameter of 4 cm features a working pressure as high as the atmospheric pressure, making it equivalent to a plasma jet type MPCVD apparatus; a SLAN source with a diameter of 67 cm is equivalent to a plasma source working at a low pressure.

In 1997, a research team at the Institute of Plasma Physics of the Chinese Academy of Sciences employed a microwave single-probe method to measure an electric field distribution in a ring waveguide slot antenna without plasma under low-power conditions and measured the characteristics of the argon plasma at the source through a Langmuir double probe method. It is said that in the future, optimization work such as increasing microwave power and reducing air pressure will be done.

In the prior art, large-scale microwave plasma generation devices utilize the diffraction effect of the slot antenna since slots openings are provided on a waveguide wall to form waveguide slot antennas. However, the field intensity is mainly concentrated at the slot opening. This can cause a problem of secondary plasma etching the dielectric window when the power is too high. In recent years, waveguide slot array antennas have been widely used because of their distinct advantages such as low loss, high radiation efficiency, and stable performance, and are seen as a possible improvement in apparatuses for microwave-plasma deposition of diamond films.

A prior art approach can be divided into two main technical solutions. The first technical solution focuses on the effect of improving the electric field through the cooperation of a slot and a gap. This is in order to obtain a more uniform plasma, which only involves the structural design of the resonant cavity. In an actual application, the microwave plasma deposition apparatus needs to further include but not limited to an impedance tuning structure, a microwave source, a circulator, cooling and gas inlet and outlet systems, and other structures, all of which need to show relevant indicators matched with relevant apparatuses on a basis of a simulation analysis and performance requirements, that is, a single resonant cavity is not universal. Not to mention there is no multi-port phase regulation. In the second technical solution, the microwave is fed from the side of the resonant cavity. This increases the microwave transmission distance and causes substantial energy attenuation, affecting the coupling efficiency and hindering the simplification of an apparatus structure. Moreover, microwaves are coupled into a plasma chamber through a gap, which must form an area where multiple strong fields are mixed. However, in an actual application, it is a stable and concentrated single strong field region that is needed to excite the gas to form a plasma for the deposition of diamond films, that is, the interior of the deposition apparatus is defective. In addition, a three-pin tuner and a short-circuit piston structure can only function for the tuning of the TE mode, and cannot for the TM mode, that is, the magnetic field cannot be effectively tuned; a dead zone for matching exists in an original admittance chart for a pin top structure, which shows that the tuning capability of the apparatus is limited. Furthermore, the multi-ring waveguide resonator and the plasma chamber can be coupled in one direction to produce a large-scale plasma, but in this case, the structure of the apparatus is complicated and expensive.

SUMMARY

The prior art has at least the following defects, that is, carbon is easy to be deposited on a top baffle in use, which is not conducive to the growth of diamond; the plasma density is low, and the deposited diamond film area is small; the cooling efficiency of the apparatus is low, which is not conducive to increasing the microwave input power. In view of the above, it is an object of the present disclosure to provide a multi-port phase compensation nested apparatus for microwave-plasma deposition of diamond films, and the technical solution is as follows.

A multi-port phase compensation nested apparatus for microwave-plasma deposition of diamond films, including a resonant cavity part and a microwave transmission part, wherein the resonant cavity part includes an inner cavity body, a ring waveguide, a slot opening, a quartz ring, a metal platform, a deposition platform, a substrate, and a recess, wherein the slot opening is located on a wall of the inner cavity body, and communicates the inner cavity body with the ring waveguide; the metal platform is configured around a bottom of the inner cavity body, and the metal platform supports the quartz ring; the deposition platform is provided at a center of the bottom of the inner cavity body, and is H-shaped; the substrate is provided above the deposition platform, and is circular disc-shaped; the recess is provided on a top of the inner cavity body, and is cylindrical; the inner cavity body and the quartz ring are both hollow cylindrical; the ring waveguide is arranged around the inner cavity body, and is circular ring-shaped with a rectangular cross-section; a plurality of the microwave transmission parts are provided, all of which are connected to the resonant cavity part for feeding microwaves into the inner cavity body; the microwave transmission part includes a microwave source, a circulator, and a waveguide magic T structure; the microwave source generates microwave oscillations; the circulator is arranged at an outlet of the microwave source to protect the microwave source from reflected microwave power; the waveguide magic T structure is used for tuning impedance.

Preferably, the microwave source includes a fully shielded magnetron or microwave transistor.

Preferably, the apparatus further includes a flange cover disposed on the top and bottom of the inner cavity body, assembled detachably with the inner cavity body.

Preferably, the apparatus further includes a gas inlet and a gas outlet; the gas inlet is located at the bottom of the cylindrical recess on the top of the inner cavity body, and injects a gas vertically downwards to the H-shaped deposition platform; and the gas outlet is located at the bottom of the inner cavity body on both sides of the H-shaped deposition platform.

Preferably, the apparatus further includes observation holes provided around an outer wall of the inner cavity body.

Preferably, the apparatus further includes an infrared thermometer provided on an upper half outer wall of the inner cavity body. This thermometer points to the center of a spherical plasma formed in the inner cavity body during resonance.

Preferably, the apparatus further includes an air-cooling device provided under the inner cavity body for dissipating heat from the quartz ring.

Preferably, the apparatus further includes water-cooling devices provided on the flange cover, the deposition platform, the magnetron, and the circulator.

Preferably, the depth of the recess and the height of the deposition platform are adjustable.

Preferably, an excitation method of controlling multiple ports to input with different microwave powers according to a preset phase is adopted.

This disclosure has at least the following benefits over the prior art. 1. A microwave plasmonic apparatus coupled with a multi-port phase-modulated slot antenna is provided. Specifically, a feeding method of controlling multiple ports to input with different microwave powers according to a certain phase is adopted to enhance the strength of an electric field coupled into a plasma chamber, thereby increasing the degree of gas excitation and generating more concentrated plasmas with a higher density.

2. In such a design of apparatus, a three-pin tuner, a short-circuit piston, and a mode converter are eliminated, which simplifies the structure of the microwave plasma deposition apparatus.

3. The microwave in the TE mode is directly fed into a resonant cavity to avoid attenuation of the microwave energy by feeding from the side. In addition, the coupling efficiency is improved.

4. Regarding the impedance tuning structure, multiple sets of waveguide magic T structures are coupled electromagnetically, and the three-pin tuner and short-circuit piston are canceled so that there is no dead zone in impedance matching, and tuning is facilitated.

5. The internal structure of the resonant cavity part is optimized, and a single strong field region is formed in the plasma chamber, which allows for a larger and more stable volume of the deposited plasma, ready for the preparation of large-scale diamond films.

6. The problem of low microwave power of conventional slot antenna is solved. A quartz dielectric is close to the deposition platform. It cuts a largest electric field region accurately from the plasma chamber, which can prevent the inner wall of the quartz ring from being etched by the secondary plasma. The apparatus herein may enable high-efficiency deposition of large-area high-quality diamond films under the condition of a relatively high microwave input power (10 kw).

DETAILED DESCRIPTION

In order that the object, technical solution, and advantages of the present disclosure are clear, the present disclosure will be further described in detail below. This will be in conjunction with the accompanying drawings and embodiments. It should be understood that the embodiments described here are only intended to describe the present disclosure, not to limit the present disclosure.

On the contrary, the present disclosure covers any alternatives, modifications, equivalent methods and solutions within the spirit and scope of the disclosure as defined by the claims. Further, for the public to have a better understanding of the present disclosure, some details are provided specifically in the detailed description of the present disclosure below. The present disclosure can be fully understood by those skilled in the art without a description of these details.

Figure 1:
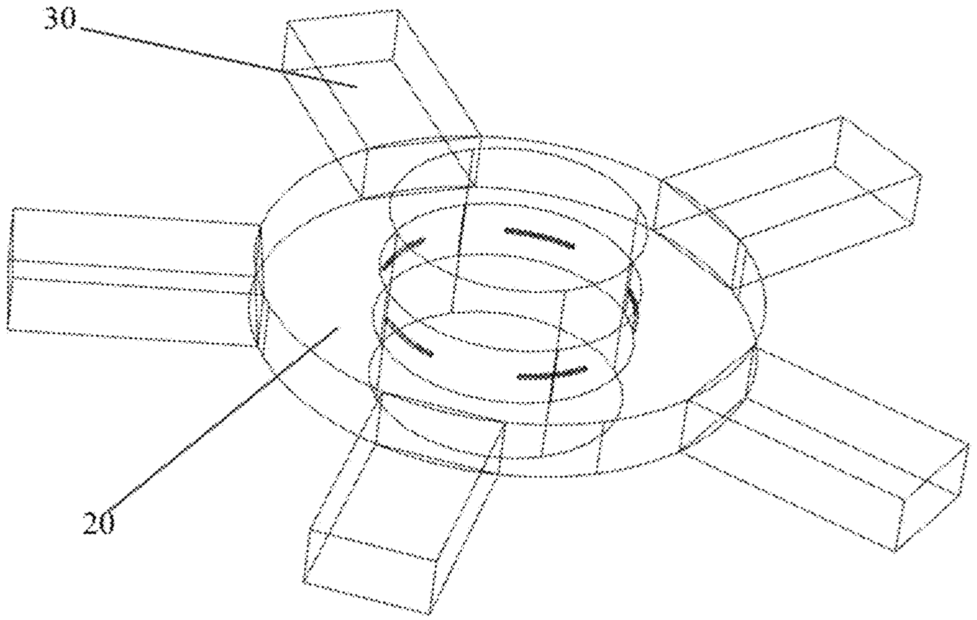
FIG. 1 is a schematic structural diagram of a multi-port phase compensation nested apparatus for microwave-plasma deposition of diamond films according to an embodiment of the present disclosure.
Figure 2:
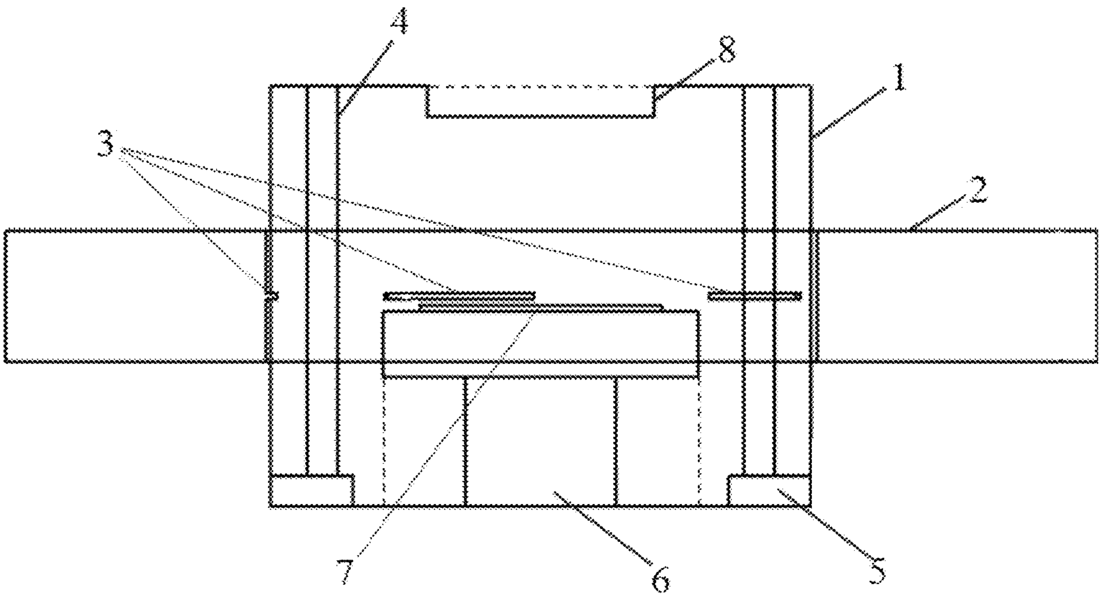
FIG. 2 is a schematic diagram of a resonant cavity part of the multi-port phase compensation nested apparatus for microwave-plasma deposition of diamond films according to an embodiment of the present disclosure.
Figure 3:
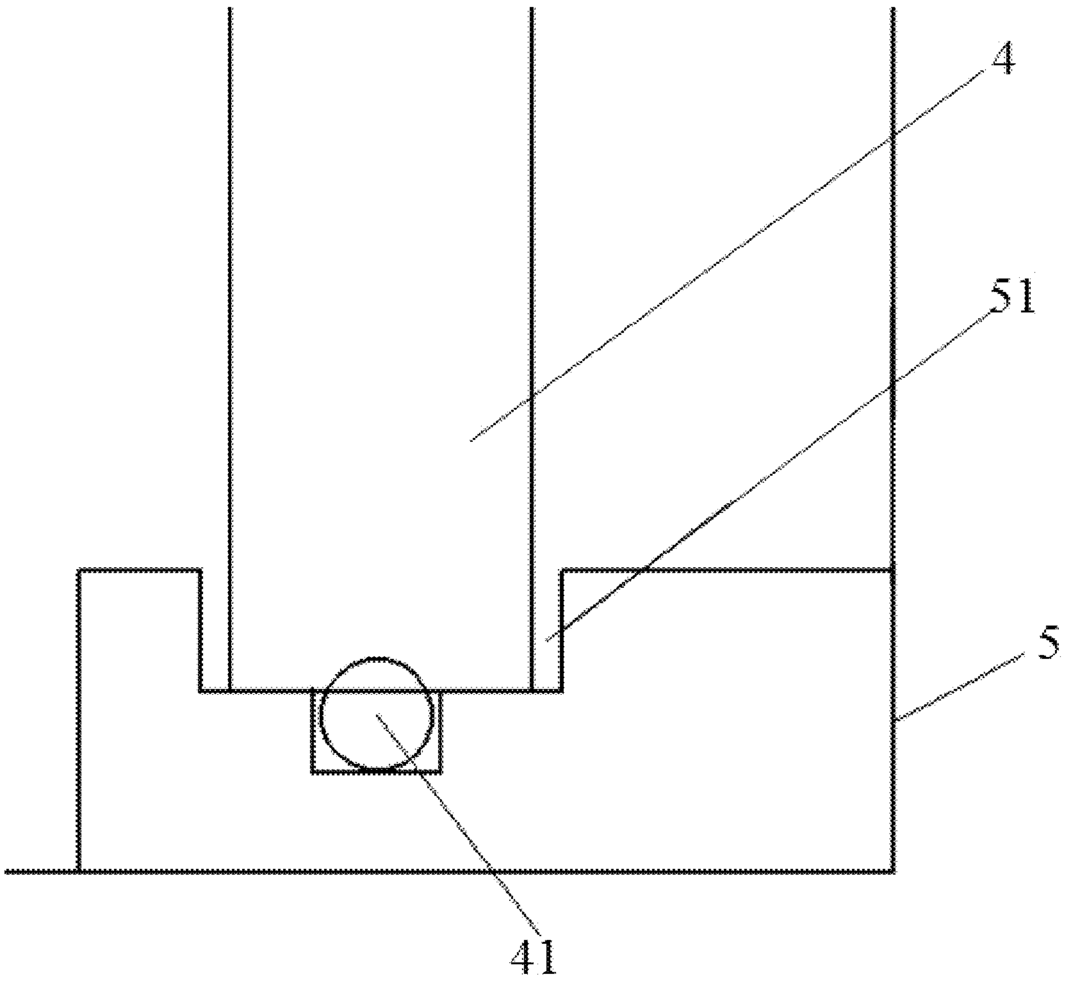
FIG. 3 is a schematic structural diagram showing an enlarged view of a bottom of a quartz ring of the multi-port phase compensation nested apparatus for microwave-plasma deposition of diamond films according to an embodiment of the present disclosure.
Figure 4:
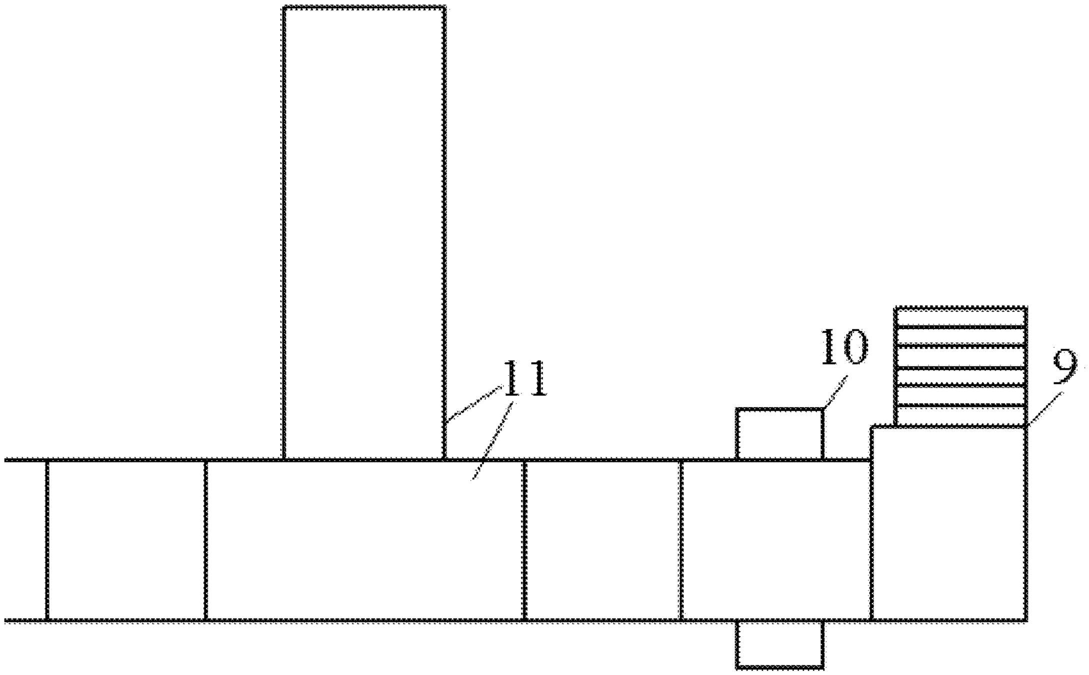
FIG. 4 is a schematic structural diagram of a microwave transmission part of the multi-port phase compensation nested apparatus for microwave-plasma deposition of diamond films according to an embodiment of the present disclosure.

Referring to FIGS. 1 to 3, a multi-port phase compensation nested apparatus for microwave-plasma deposition of diamond films according to an embodiment of the present disclosure is shown, including a resonant cavity part 20 and a microwave transmission part 30, wherein the resonant cavity part 20 includes an inner cavity body 1, a ring waveguide 2, a slot opening 3, a quartz ring 4, a metal platform 5, a deposition platform 6, a substrate 7, and a recess 8, wherein the slot opening 3 is located on a wall of the inner cavity body 1, and communicates the inner cavity body 1 with the ring waveguide 2; the metal platform 5 is configured around a bottom of the inner cavity body 1, and the metal platform 5 supports the quartz ring 4; the deposition platform 6 is provided at a center of the bottom of the inner cavity body 1, and is H-shaped; the substrate 7 is provided above the deposition platform 6, and is circular disc-shaped; the recess 8 is provided on a top of the inner cavity body 1, and is cylindrical; the inner cavity body 1 and the quartz ring 4 are both hollow cylindrical; the ring waveguide 2 is arranged around the inner cavity body 1, and is circular ring-shaped with a rectangular cross-section;

a plurality of the microwave transmission parts 30 are provided, all of which are connected to the resonant cavity part 20 for feeding microwaves into the inner cavity body 1; the microwave transmission part 30 includes a microwave source 9, a circulator 10, and a waveguide magic T structure 11; the microwave source 9 generates microwave oscillations; the circulator 10 is arranged at an outlet of the microwave source 9 to protect the microwave source 9 from reflected microwave power; the waveguide magic T structure 11 is used for tuning impedance. The microwave source 9 includes a fully shielded magnetron or microwave transistor.

As to the design of the apparatus described above, firstly, a field distribution of the microwave with a frequency of 2.45 GHz in a standard WR340 rectangular waveguide is analyzed with the help of electromagnetic simulation software, and surface currents alternating vertically downwards and vertically upwards on a side of the rectangular waveguide are noted. A slot may be opened horizontally on a side wall of the waveguide to cut the surface currents vertically and may radiate the microwave energy in the waveguide from the side, which is equivalent to a slot antenna; a straight rectangular waveguide may be rolled into a ring to form the side of the waveguide into a cylindrical side for converging the microwave energy, and an initial waveguide part structure can be obtained. Secondly, it can be learned from relevant theories of waveguide transmission that this part structure is optimized until uniformly distributed strong field regions are formed in the ring waveguide 2. It is noted that directions of the magnetic field in each strong field region are clockwise and counterclockwise alternately. If microwaves are to be coupled into the inner cavity from an inner wall of the ring waveguide 2, it is then necessary to select a region where the magnetic field inside the ring waveguide 2 is in the same direction as the inner cavity magnetic field to be excited to process the slot opening 3. The size of the slot opening 3 needs to be optimized by combining the electromagnetic field numerical analysis method and analyses of various parameters of the slot antenna with the help of high-frequency electromagnetic analysis software. The shape of the inner cavity body 1 can be a simplest cylinder, and the specific size can be determined by using the characteristic frequency method. Finally, the internal structure is optimized to obtain the complete resonant cavity part 20, and then the microwave transmission part 30 is added.

The present disclosure adopts an excitation method of controlling multiple ports to input with different microwave powers according to a preset phase to enhance the strength of the electric field coupled into the inner cavity body 1 and improve the coupling efficiency.

The microwave transmission part 30 is directly fed into the resonant cavity part 20 to avoid the attenuation of the microwave energy by feeding from the side.

A three-pin tuner and a short-circuit piston are replaced with multiple sets of waveguide magic T structures 11, so that there is no dead zone in impedance matching and tuning is facilitated;

the quartz ring 4 is close to the deposition platform 6 and cuts a largest electric field region accurately from the plasma chamber, which can prevent the inner wall of the quartz ring 4 from being etched by the secondary plasma.

Figure 5:
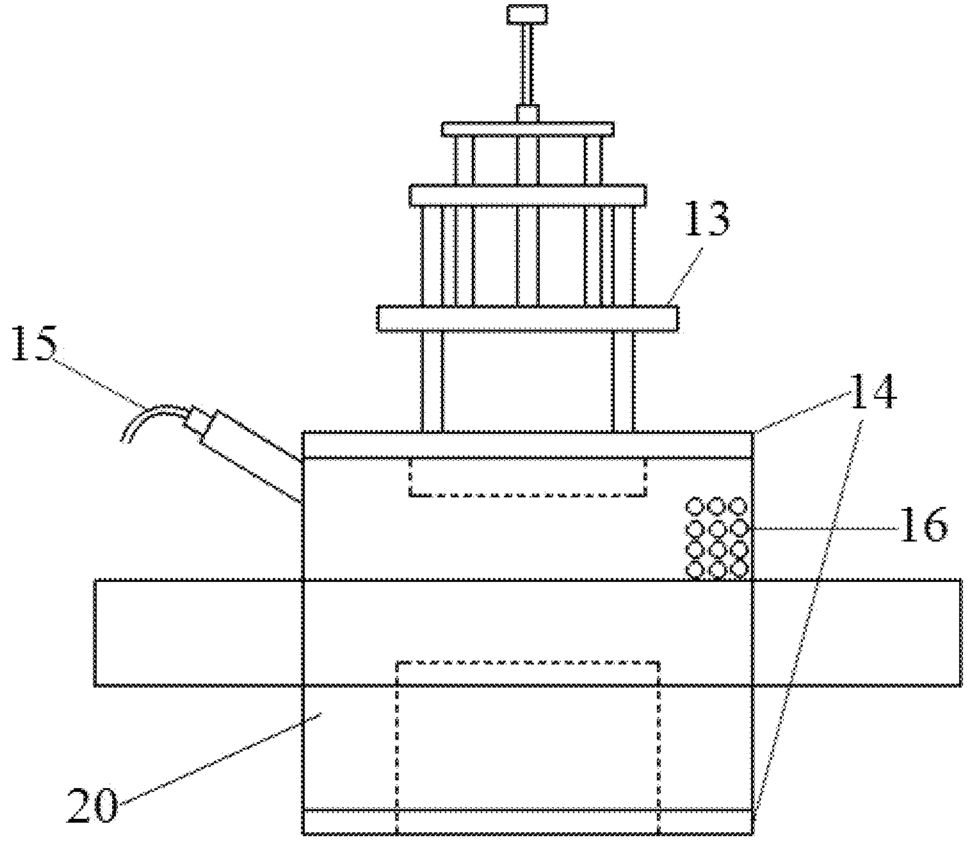
FIG. 5 is a schematic structural diagram showing an exterior of a resonant cavity of the multi-port phase compensation nested apparatus for microwave-plasma deposition of diamond films according to an embodiment of the present disclosure.

In an embodiment, referring to FIG. 5, a metal bellow 13 is provided above the resonant cavity part 20 for controlling the elevation of a depth of the cylindrical recess 8 on the top of the inner cavity body 1, and the bottom H-shaped deposition platform 6 also has an elevatable structure, both being able to adjust the electric field distribution of the inner cavity body 1 during resonance to produce a better plasma state and a better overall tunability of the apparatus. The flange cover 14 is located on the top and bottom of the resonant cavity part 20 and is detachable to ensure the overall airtightness of the apparatus. The gas inlet is located at the bottom of the cylindrical recess 8 on the top of the inner cavity body 1, and injects a gas vertically downwards to the H-shaped deposition platform 6, which is conducive to the concentrated excitation of the plasma on the deposition platform 6; the gas outlet is located at the bottom of the inner cavity body 1 on both sides of the H-shaped deposition platform 6. An infrared thermometer 15 is provided on an outer wall of an upper half structure of the resonant cavity part 20, pointing to a center of a spherical plasma formed by the inner cavity body 1 during resonance. Observation holes 16 are arranged below the infrared thermometer 15 and around the outer wall of the upper half structure of the resonant cavity part 20. A full-circle arrangement is not shown in FIG. 5, and only a part of a circle is shown as an example. There is a mesh structure at a junction between the observation holes 16 and the outer wall of the inner cavity body 1, which prevents microwaves from radiating to the outside of the resonant cavity part 20 through the observation holes 16; the plasma excitation can be directly observed through the observation holes 16, and a diameter of the mesh is generally less than one-eighth of the microwave wavelength, and can be set as 6 mm in actual applications; The resonant cavity part 20 is sealed mainly by a structure of the quartz ring 4 surrounding a plasma reaction chamber, and the observation holes 16 need only to ensure the airtightness of the whole apparatus. As to the airtightness performance of the quartz ring 4, reference may be specifically made to FIG. 3, a platform recess 51 is provided on a top of the metal platform 5, and a bottom of quartz ring 4 is embedded in this platform recess 51, and the bottom of this platform recess 51 is embedded in a rubber gasket 41, and the top of the quartz ring 4 is bordered with the top of the inner cavity body 1, and the bottom of the quartz ring 4 squeezes the rubber gasket 41 to ensure the overall sealing of the structure of the quartz ring 4 part. In the electromagnetic simulation software, the position of the quartz ring 4 can be parameterized to observe the electric field distribution variation in the resonant cavity part 20, and a position of the quartz ring 4 corresponding to a concentrated electric field distribution and a larger field region is selected as the optimal solution.

A cooling system mainly includes two parts. An air-cooling device is provided close to the bottom of the resonant cavity part 20 for dissipating heat from the quartz ring 4. The water-cooling device indirectly contacts the flange cover 14 at the top and bottom of the resonant cavity part 20 structure, the H-shaped deposition platform 6 in the inner cavity body 1, the magnetron, and the circulator 10 through water inlet and outlet pipes; the water flow is adjusted by a water knockout trap to match the cooling requirements of each part, so as to ensure the stable operation of the whole apparatus with input under a high microwave power.

The microwave source 9 includes a fully shielded magnetron for generating microwaves with required power; the circulator 10 is arranged at an outlet of the magnetron to protect the magnetron from reflected microwave power; the microwave source 9 can generate microwave oscillations through different electronic devices, including magnetrons, microwave transistors, etc. The tuning part adopts the waveguide magic T structure 11, which is composed of an E-T branch and an H-T branch, which can adjust the microwave input impedance of the plasma source and reduce the reflection coefficient.

Figure 6:
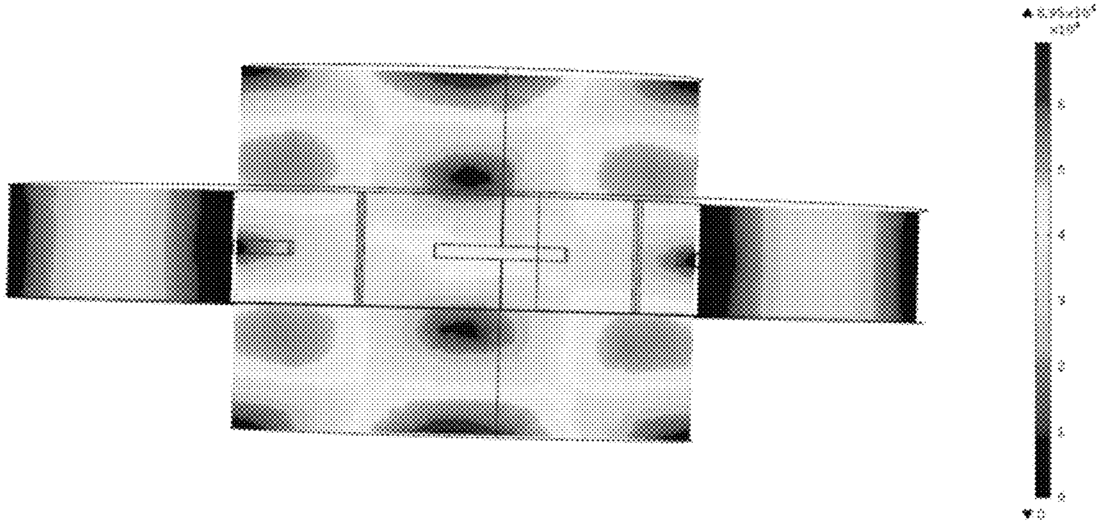
FIG. 6 is a diagram showing an electric field distribution at the resonant cavity part in the prior art.

Microwaves are directly fed into the resonant cavity part 20 through the waveguide magic T structure 11, forming ten uniformly distributed strong field regions in the ring waveguide 2, wherein the number of strong field regions in the ring waveguide 2 is adjustable, and a difference between the inner and outer diameters of the ring waveguide 2 is constant, which is approximately the wavelength of the waveguide, but the length of the inner diameter can be adjusted within a certain range according to a desired size of the plasma chamber deposited in the inner cavity body 1. Note that a too-large inner diameter will affect the concentration of microwave energy, and a too-small inner diameter will lead to a too-small size of the deposited diamond film, and the research on the apparatus itself will be meaningless. Practically, ten field regions are selected in an embodiment. Strong field regions in which the magnetic field in the ring waveguide 2 is consistent with a rotation direction of the magnetic field in the inner cavity to be excited are selected, and a ring-shaped slot opening 3 is provided, whose length is similar to a length of an inner ring curve of the selected regions. The microwave is coupled into the inner cavity body 1 from the slot opening 3 to form multiple strong field regions, and the electric field distribution is shown in FIG. 6. At this time, one microwave transmission part 30 is used, and when a multi-port input structure is added later, another microwave transmission part 30 can be added, with a power divider to distribute the microwave energy for each port.

Figure 7:
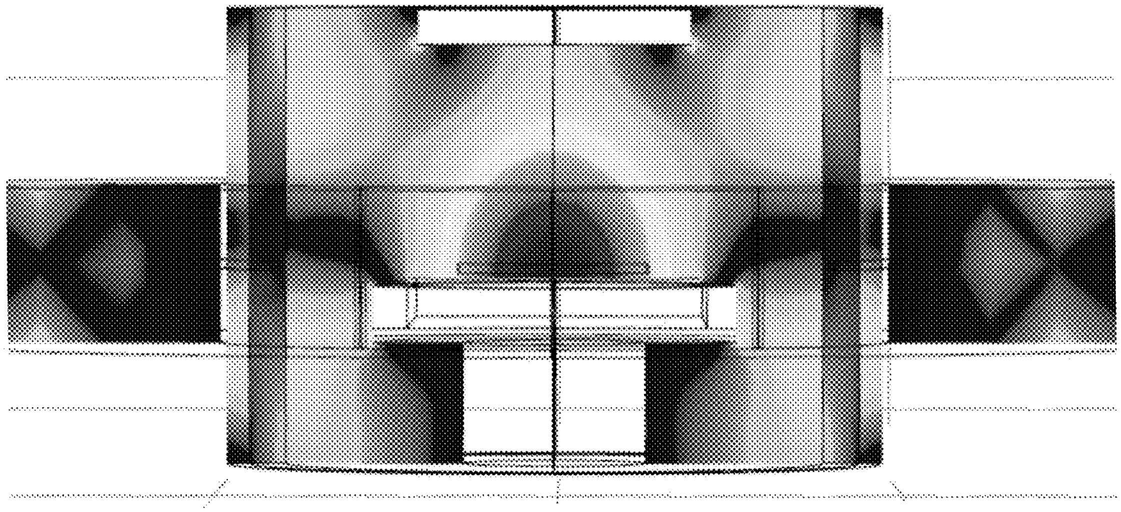
FIG. 7 shows an initial electric field distribution of a slot coupling of the resonant cavity part of the multi-port phase compensation nested apparatus for microwave-plasma deposition of diamond films according to an embodiment of the present disclosure.
Figure 8:
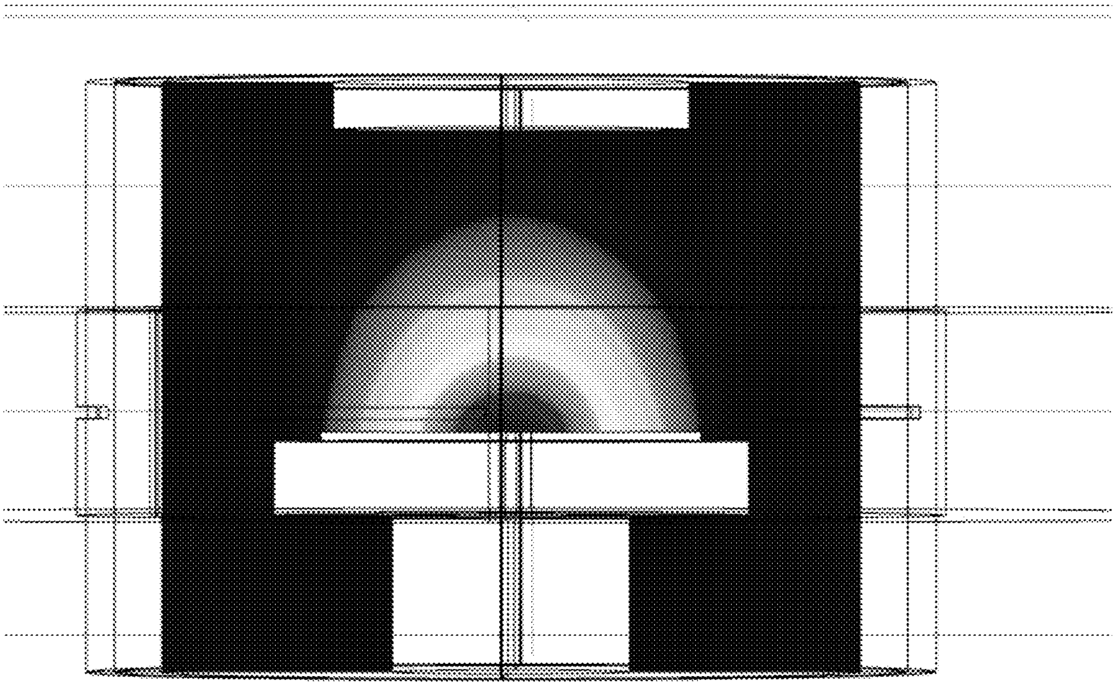
FIG. 8 is a distribution diagram showing an ne image of the resonant cavity part of the multi-port phase compensation nested apparatus for microwave-plasma deposition of diamond films according to an embodiment of the present disclosure.

After the microwave is successfully fed in, a cylindrical deposition platform 6 is added to the inner cavity body 1 for plasma deposition in the center of the inner cavity body 1; the substrate is above the deposition platform 6 of a small size. The quartz ring 4 is constructed near the slot opening 3, and the bottom of the quartz ring 4 is fixed on a slightly wider metal platform 5 by digging a recess to embed the rubber gasket 41. The top of the inner cavity body 1 is recessed in a cylindrical shape to compress the plasma so that the plasma is attached closely to the top of the deposition platform 6. To further improve the tuning effect, the deposition platform 6 can also be shaped in an H-shape to reduce the electric field distribution. The electric field distribution and the ne image of the structure of the resonant cavity part 20 after optimization are shown in FIGS. 7 and 8, respectively. The shown apparatus structure only includes one microwave transmission part 30, that is, one microwave source 9 is used.

Multi-port input structure: by controlling a certain phase, ports with different microwave input power are added, and the conventional single microwave port input mode is upgraded to a multi-port microwave input mode, so that the strength of electric fields coupled into the inner cavity body 1 is increased, thereby achieving a higher degree of excitation of the gas, resulting in a higher-density plasma.

Figure 9:
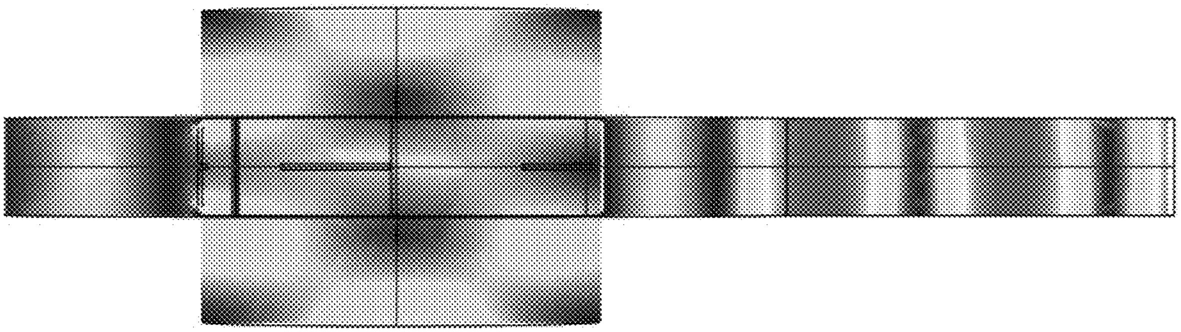
FIG. 9 is a diagram showing an electric field distribution at a five-port resonant cavity part of the multi-port phase compensation nested apparatus for microwave-plasma deposition of diamond films according to an embodiment of the present disclosure.

FIG. 1 and FIG. 9 show the simplest five-port structures with the same input power with a phase difference of 72 degrees and the corresponding electric field diagrams, and it can be seen that the max strength value of the electric field coupled into the inner cavity body 1 is nearly doubled. Apparently, there are many other optimization structures, and the key point is to control the multiple ports according to a certain phase to enhance the coupling effect on the electric field in the inner cavity body 1 with different microwave power input and phase-controlled feed-in structures. Referring to FIG. 9, the structures of the five microwave transmission parts 30 are consistent except for the microwave source 9; the microwave power input to each port can be distributed through a power divider, and the number of the microwave source 9 can be increased to two.

Operation of the Apparatus

1. Open the gas inlet and gas outlet of the resonant cavity part 20, feed in the external air spontaneously to balance the internal and external air pressure of the inner cavity body 1, turn on a stepping motor to lower the deposition platform 6, and select a properly-sized silicon wafer to be placed on the top of the deposition platform 6 as the substrate 7, and lift the deposition platform 6 to the bottom of the inner cavity body 1 and keep them together;

2. take a vacuum pump to evacuate a low-pressure area surrounded by the quartz ring 4 inside the inner cavity body 1 (the range of the low-pressure area is the area surrounded by the quartz ring 4 in the inner cavity body 1, which is vacuumed before the microwave works, and gas is introduced to adjust the internal air pressure, hence this area is called low-pressure area); at the same time, observe the readings of pressure gauges in large and small ranges, introduce a reaction gas when the requirements are met, and adjust the gas pressure in the apparatus;
3. turn on the water-cooling and air-cooling devices, check whether the flow rate and other parameters meet the requirements through a flow sensor, and check other details of the overall apparatus;
4. input a microwave with a frequency of 2.45 GHz and a power of 10000 W, observe the generation of plasma through the observation hole 16; adjust the position of the short-circuit piston of the waveguide magic T structure 11 and the height of the metal bellow 13 to reduce the reflection coefficient of the apparatus, and then start depositing the diamond film;
5. after a period of deposition, turn off the gas, microwave source, and vacuum pump in sequence to end the deposition of the diamond film.

The above description is only the preferred embodiments of the present disclosure and are not intended to limit the present disclosure. Any modifications, equivalent replacements and improvements made within the spirit and principle of the present disclosure shall fall within the scope of the present disclosure.

The invention claimed is:

1. A multi-port phase compensation nested apparatus for microwave-plasma deposition of diamond films, comprising a resonant cavity part and a microwave transmission part, wherein the resonant cavity part comprises an inner cavity body, a ring waveguide, a slot opening, a quartz ring, a metal platform, a deposition platform, a substrate, and a recess, wherein the slot opening is located on a wall of the inner cavity body, and communicates the inner cavity body with the ring waveguide; the metal platform is configured around a bottom of the inner cavity body, and the metal platform supports the quartz ring; the deposition platform is provided at a center of the bottom of the inner cavity body, and is H-shaped; the substrate is provided above the deposition platform, and is circular disc-shaped; the recess is provided on a top of the inner cavity body, and is cylindrical; the inner cavity body and the quartz ring are both hollow cylindrical; the ring waveguide is arranged around the inner cavity body, and is circular ring-shaped with a rectangular cross-section;

a plurality of the microwave transmission parts are provided, all of which are connected to the resonant cavity part for feeding microwaves into the inner cavity body; the microwave transmission part comprises a microwave source, a circulator, and a waveguide magic T structure; the microwave source generates microwave oscillations; the circulator is arranged at an outlet of the microwave source to protect the microwave source from reflected microwave power; the waveguide magic T structure is used for tuning impedance, wherein the plurality of microwave transmission parts are configured to feed microwaves into the ring waveguide with a predetermined phase relationship therebetween; and wherein an inner wall surface of the quartz ring is disposed adjacent to an outer sidewall surface of the H-shaped deposition platform.

2. The multi-port phase compensation nested apparatus for microwave-plasma deposition of diamond films according to claim 1, wherein the microwave source comprises a fully shielded magnetron or microwave transistor.

3. The multi-port phase compensation nested apparatus for microwave-plasma deposition of diamond films according to claim 1, further comprising a flange cover disposed on the top and bottom of the inner cavity body, assembled detachably with the inner cavity body.

4. The multi-port phase compensation nested apparatus for microwave-plasma deposition of diamond films according to claim 1, further comprising a gas inlet and a gas outlet; the gas inlet is located at a bottom of the cylindrical recess on the top of the inner cavity body, and injects a gas vertically downwards to the H-shaped deposition platform; the gas outlet is located at the bottom of the inner cavity body on both sides of the H-shaped deposition platform.

5. The multi-port phase compensation nested apparatus for microwave-plasma deposition of diamond films according to claim 1, further comprising observation holes provided around an outer wall of the inner cavity body.

6. The multi-port phase compensation nested apparatus for microwave-plasma deposition of diamond films according to claim 1, further comprising an infrared thermometer provided on an upper half outer wall of the inner cavity body, pointing to a center of a spherical plasma formed in the inner cavity body during resonance.

7. The multi-port phase compensation nested apparatus for microwave-plasma deposition of diamond films according to claim 1, further comprising an air-cooling device provided under the inner cavity body for dissipating heat from the quartz ring.

8. The multi-port phase compensation nested apparatus for microwave-plasma deposition of diamond films according to claim 1, further comprising water-cooling devices provided on the flange cover, the deposition platform, the magnetron, and the circulator.

9. The multi-port phase compensation nested apparatus for microwave-plasma deposition of diamond films according to claim 1, wherein a depth of the recess and a height of the deposition platform are adjustable.

10. The multi-port phase compensation nested apparatus for microwave-plasma deposition of diamond films according to claim 1, wherein an excitation method of controlling multiple ports to input with different microwave powers according to a preset phase is adopted to excite and maintain a substantially spherical plasma at a center of the inner cavity body.

* * * * *